(12) United States Patent
Schricker et al.

(10) Patent No.: US 8,183,121 B2
(45) Date of Patent: May 22, 2012

(54) CARBON-BASED FILMS, AND METHODS OF FORMING THE SAME, HAVING DIELECTRIC FILLER MATERIAL AND EXHIBITING REDUCED THERMAL RESISTANCE

(75) Inventors: April D. Schricker, Palo Alto, CA (US); Steven Maxwell, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 34 days.

(21) Appl. No.: 12/415,011

(22) Filed: Mar. 31, 2009

(65) Prior Publication Data

US 2010/0245029 A1 Sep. 30, 2010

(51) Int. Cl.
*H01L 21/20* (2006.01)
*H01L 29/00* (2006.01)

(52) U.S. Cl. ........................................ 438/381; 257/528
(58) Field of Classification Search .................. None
See application file for complete search history.

(56) References Cited

U.S. PATENT DOCUMENTS

| | | | |
|---|---|---|---|
| 5,629,666 A * | 5/1997 | Imai et al. ................ | 338/20 |
| 5,915,167 A | 6/1999 | Leedy | |
| 6,333,016 B1 | 12/2001 | Resasco et al. | |
| 6,420,092 B1 | 7/2002 | Yang et al. | |
| 6,833,558 B2 | 12/2004 | Lee et al. | |
| 6,863,942 B2 | 3/2005 | Ren et al. | |
| 6,885,021 B2 | 4/2005 | Apodaca et al. | |
| 6,919,592 B2 | 7/2005 | Segal et al. | |
| 6,952,030 B2 | 10/2005 | Herner et al. | |
| 6,969,651 B1 | 11/2005 | Lu et al. | |
| 6,986,877 B2 | 1/2006 | Takikawa et al. | |
| 7,056,758 B2 | 6/2006 | Segal et al. | |
| 7,084,062 B1 | 8/2006 | Avanzino et al. | |
| 7,176,064 B2 | 2/2007 | Herner | |
| 7,224,033 B2 | 5/2007 | Zhu et al. | |
| 7,285,464 B2 | 10/2007 | Herner et al. | |
| 7,301,191 B1 | 11/2007 | Tombler et al. | |
| 7,345,296 B2 | 3/2008 | Tombler, Jr. et al. | |
| 7,374,987 B2 | 5/2008 | Chidambarrao et al. | |
| 7,483,285 B2 | 1/2009 | Furukawa et al. | |
| 7,560,136 B2 | 7/2009 | Ward et al. | |
| 7,575,984 B2 | 8/2009 | Radigan et al. | |
| 7,615,432 B2 | 11/2009 | Kim et al. | |
| 7,618,300 B2 | 11/2009 | Liu et al. | |
| 7,768,016 B2 | 8/2010 | Kreupl | |

(Continued)

FOREIGN PATENT DOCUMENTS

EP 1 361 608 A2 11/2003

(Continued)

OTHER PUBLICATIONS

Li et al., U.S. Appl. No. 12/466,197, filed May 14, 2009.

(Continued)

*Primary Examiner* — Scott B Geyer
(74) *Attorney, Agent, or Firm* — Dugan & Dugan, PC

(57) ABSTRACT

Methods in accordance with aspects of this invention form microelectronic structures in accordance with other aspects this invention, such as non-volatile memories, that include (1) a bottom electrode, (2) a resistivity-switchable layer disposed above and in contact with the bottom electrode, and (3) a top electrode disposed above and in contact with the resistivity-switchable layer; wherein the resistivity-switchable layer includes a carbon-based material and a dielectric filler material. Numerous additional aspects are provided.

24 Claims, 4 Drawing Sheets

U.S. PATENT DOCUMENTS

| | | | |
|---|---|---|---|
| 2003/0073295 | A1 | 4/2003 | Xu |
| 2003/0222560 | A1 | 12/2003 | Roach |
| 2004/0159835 | A1 | 8/2004 | Krieger et al. |
| 2005/0019494 | A1 | 1/2005 | Moghadam et al. |
| 2005/0052915 | A1 | 3/2005 | Herner et al. |
| 2005/0148271 | A1 | 7/2005 | Yaniv et al. |
| 2005/0226067 | A1 | 10/2005 | Herner et al. |
| 2006/0038212 | A1 | 2/2006 | Moore et al. |
| 2006/0097342 | A1 | 5/2006 | Parkinson |
| 2006/0234418 | A1 | 10/2006 | Ufert |
| 2006/0269692 | A1 | 11/2006 | Balseanu et al. |
| 2007/0020919 | A1 | 1/2007 | Adem et al. |
| 2007/0128858 | A1 | 6/2007 | Haukka et al. |
| 2007/0200243 | A1 | 8/2007 | Kraus et al. |
| 2007/0221998 | A1 | 9/2007 | Park |
| 2007/0252131 | A1 | 11/2007 | Tong et al. |
| 2007/0269992 | A1 | 11/2007 | Yang et al. |
| 2008/0070162 | A1 | 3/2008 | Ufert |
| 2008/0099752 | A1 | 5/2008 | Kreupl et al. |
| 2008/0101121 | A1 | 5/2008 | Kreupl |
| 2008/0107892 | A1 | 5/2008 | Jiao et al. |
| 2008/0135834 | A1 | 6/2008 | Kaza et al. |
| 2008/0173858 | A1 | 7/2008 | An et al. |
| 2008/0210923 | A1 | 9/2008 | Sato |
| 2008/0230826 | A1 | 9/2008 | Das |
| 2008/0233396 | A1 | 9/2008 | Raravikar et al. |
| 2008/0237599 | A1 | 10/2008 | Herner et al. |
| 2008/0237733 | A1 | 10/2008 | Chen et al. |
| 2008/0239790 | A1 | 10/2008 | Herner et al. |
| 2008/0308785 | A1 | 12/2008 | Park et al. |
| 2009/0166609 | A1 | 7/2009 | Schricker et al. |
| 2009/0166610 | A1 | 7/2009 | Schricker et al. |
| 2009/0168491 | A1 | 7/2009 | Schricker et al. |
| 2009/0213643 | A1 | 8/2009 | Angerbauer et al. |
| 2009/0225588 | A1 | 9/2009 | Czubatyj et al. |
| 2009/0257270 | A1 | 10/2009 | Schricker et al. |
| 2010/0001267 | A1 | 1/2010 | Manning et al. |
| 2010/0006811 | A1 | 1/2010 | Xu et al. |
| 2010/0008122 | A1 | 1/2010 | Tilke |
| 2010/0012912 | A1 | 1/2010 | Schricker |
| 2010/0019317 | A1 | 1/2010 | Moroz et al. |
| 2010/0032638 | A1 | 2/2010 | Xu |
| 2010/0078759 | A1 | 4/2010 | Sekar et al. |
| 2010/0102291 | A1 | 4/2010 | Xu |
| 2010/0108976 | A1 | 5/2010 | Jayasekara et al. |
| 2010/0108981 | A1 | 5/2010 | Jayasekara |
| 2010/0108982 | A1* | 5/2010 | Ping et al. ......................... 257/5 |

FOREIGN PATENT DOCUMENTS

| | | |
|---|---|---|
| EP | 1 739 753 | 1/2007 |
| EP | 1 892 722 A | 2/2008 |
| EP | 1 916 722 A | 4/2008 |
| JP | 2006/063369 | 3/2006 |
| WO | WO 2004/070735 | 8/2004 |
| WO | WO 2005/045871 | 5/2005 |
| WO | WO 2006/078505 A2 | 7/2006 |
| WO | WO 2006/079979 | 8/2006 |
| WO | WO 2007/130913 A2 | 11/2007 |
| WO | WO 2008/036385 | 3/2008 |
| WO | WO 2009/088889 A | 7/2009 |
| WO | WO 2009/088890 A | 7/2009 |

OTHER PUBLICATIONS

Schricker et al., U.S. Appl. No. 12/421,405, filed Apr. 9, 2009.
Schricker et al., U.S. Appl. No. 12/421,803, filed Apr. 10, 2009.
Xu et al., U.S. Appl. No. 12/465,315, filed May 13, 2009.
Jayasekara et al., U.S. Appl. No. 12/408,419, filed Mar. 20, 2009.
Budnik et al., "A High Density, Carbon Nanotube Capacitor for Decoupling Applications", DAC 2006, Jul. 24-28, 2006, pp. 935-938.
Engelsen, "The temptation of field emission displays", Physics Procedia 1 (2008), pp. 355-365.
Gerstner et al., "Nonvolatile Memory Effects in Nitrogen Doped Tetrahedral Amorphous Carbon Thin Films", Nov. 15, 1998, Journal of Applied Physics, vol. 84, No. 10, pp. 5647-5651.
Takai et al.,"Structure and Electronic Properties of a Nongraphitic Disordered Carbon System and its Heat-Treatment Effects", 2003, Physical Review B 67, 214202, pp. 214202-1-214202-11.
Bhattacharyya, et al., "Resonant Tunnelling and Fast Switching in Amorphous-Carbon Quantum-Well Structures," Dec. 2005, Nanoelectronics Centre, Advanced Technology Institute, pp. 19-22.
Dittmer et al., "Low ambient temperature CVD growth of carbon nanotubes," Appl. Phys. A 84, 2006, p. 1.
Kodama et al., "Properties of Amorphous Carbon Films Synthesized by Atmospheric Pressure Glow Plasma CVD Method," Journal of Photopolymer Science and Technology, vol. 19, No. 5, 2006, pp. 673-678.
Kong et al., "Integration of a gate electrode into carbon nanotube devices for scanning tunneling microscopy," Appl. Phys. Lett. 86, 2005, pp. 112106-1-112106-3.
Bhattacharyya, et al., "Switching behaviour and high frequency response of amorphous carbon double-barrier structures" Aug. 2007, Materials Science and Engineering C, Elsevier Science S.A, CH, vol. 27 No. 5-8, pp. 957-960.
International Search Report and Written Opinion of International Patent Application No. PCT/US2009/062330 mailed Apr. 6, 2010.
International Search Report and Written Opinion of International Patent Application No. PCT/US2009/062507 mailed Apr. 6, 2010.
International Search Report and Written Opinion of International Patent Application No. PCT/US2009/062532 mailed Apr. 6, 2010.
Leroy et al., "Thin film solid-state reactions forming carbides as contact materials for carbon-containing semiconductors", Journal of Applied Physics, vol. 101, No. 5, (2007) pp. 053714-1-053714-10.
Grill, "Plasma-deposited Diamondlike Carbon and Related Materials", Jan./Mar. 1999; IBM J. Res. Develop. vol. 43 No. 1/2, pp. 147-162.
Xu, U.S. Appl. No. 12/780,564, filed May 14, 2010.
Jayasekara, W., et al., U.S. Appl. No. 12/408,419, filed Mar. 20, 2009—Restriction Requirement mailed Sep. 1, 2010.
Jayasekara, W., et al., U.S. Appl. No. 12/408,419, filed Mar. 20, 2009—Sep. 16, 2010 Reply to Sep. 1, 2010 Restriction Requirement.
Jayasekara, W., et al., U.S. Appl. No. 12/408,419, filed Mar. 20, 2009—Office Action mailed Oct. 7, 2010.
Jayasekara, W., et al., U.S. Appl. No. 12/408,419, filed Mar. 20, 2009—Jan. 5, 2011 Reply to Oct. 7, 2010 Office Action.
Jayasekara, W., et al., U.S. Appl. No. 12/408,419, filed Mar. 20, 2009—Preliminary Amendment filed Jul. 13, 2009.
Final Office Action of Related U.S. Appl. No. 12/408,419 mailed Jun. 6, 2011.
Sep. 6, 2011 Reply to Jun. 6, 2011 Final Office Action of Related U.S. Appl. No. 12/408,419.
Office Action of Related U.S. Appl. No. 12/608,592 Nov. 11, 2011.
Office Action of Related U.S. Appl. No. 12/608,607 Nov. 17, 2011.
Jan. 31, 2012 Response to Nov. 1, 2011 Office Action of Related U.S. Appl. No. 12/608,592.
Feb. 16, 2012 Response to Nov. 17, 2011 Office Action of Related U.S. Appl. No. 12/608,607.

* cited by examiner

CARBON-BASED FILMS, AND METHODS OF FORMING THE SAME, HAVING DIELECTRIC FILLER MATERIAL AND EXHIBITING REDUCED THERMAL RESISTANCE

CROSS-REFERENCE TO RELATED APPLICATIONS

This application is related to U.S. Patent Application Ser. No. 61/044,314, filed 11 Apr. 2008, "METHODS FOR ETCHING CARBON NANO-TUBE FILMS FOR USE IN NON-VOLATILE MEMORIES," which is incorporated by reference herein in its entirety for any purpose.

This application is related to U.S. Patent Application Ser. No. 61/078,911, filed 8 Jul. 2008, "CARBON-BASED INTERFACE LAYER FOR A MEMORY DEVICE AND METHODS OF FORMING THE SAME" (the '911 application), which is incorporated by reference herein in its entirety for any purpose.

This application is related to U.S. Patent Application Ser. No. 61/108,017, filed 23 Oct. 2008, "METHODS AND APPARATUS EXHIBITING REDUCED DELAMINATION OF CARBON-BASED RESISTIVITY-SWITCHING MATERIALS," which is incorporated by reference herein in its entirety for any purpose.

This application also is related to U.S. Patent Application Ser. No. 61/109,905, filed 30 Oct. 2008, "CARBON-BASED LINER FOR PROTECTION OF CARBON NANO-TUBE FILMS AGAINST SHORT-CIRCUITING AND DAMAGE," which is incorporated by reference herein in its entirety for any purpose.

FIELD OF THE INVENTION

This invention relates to microelectronic devices, such as non-volatile memories, and more particularly to carbon-based films, and methods of forming the same, having dielectric filler material and exhibiting reduced thermal resistance.

BACKGROUND

Non-volatile memories formed from reversible resistance-switching elements are known. For example, U.S. patent application Ser. No. 11/968,154, filed Dec. 31, 2007, titled "MEMORY CELL THAT EMPLOYS A SELECTIVELY FABRICATED CARBON NANO-TUBE REVERSIBLE RESISTANCE-SWITCHING ELEMENT AND METHODS OF FORMING THE SAME" (hereinafter "the '154 Application"), which is hereby incorporated by reference herein in its entirety for all purposes, describes a rewriteable non-volatile memory cell that includes a diode coupled in series with a carbon-based reversible resistivity-switching material such as carbon.

However, fabricating memory devices from rewriteable resistivity-switching materials is technically challenging, and improved methods of forming memory devices that employ carbon-based reversible resistivity-switching materials are desirable. Likewise, there is a need for memory devices, and the methods used to make them, having carbon-based materials compatible with processes used to form the materials surrounding the carbon-based materials.

SUMMARY

In some aspects of the invention, a method of forming a microelectronic structure is provided, wherein the method includes (1) forming a resistivity-switchable layer on a bottom electrode, and (2) forming a top electrode above and in contact with the resistivity-switchable layer; wherein the resistivity-switchable layer includes a carbon-based material and a dielectric filler material.

In other aspects of the invention, a microelectronic structure is provided that includes (1) a bottom electrode, (2) a resistivity-switchable layer disposed above and in contact with the bottom electrode, and (3) a top electrode disposed above and in contact with the resistivity-switchable layer; wherein the resistivity-switchable layer includes a carbon-based material and a dielectric filler material.

Other features and aspects of this invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which.

DETAILED DESCRIPTION

Figure 1:
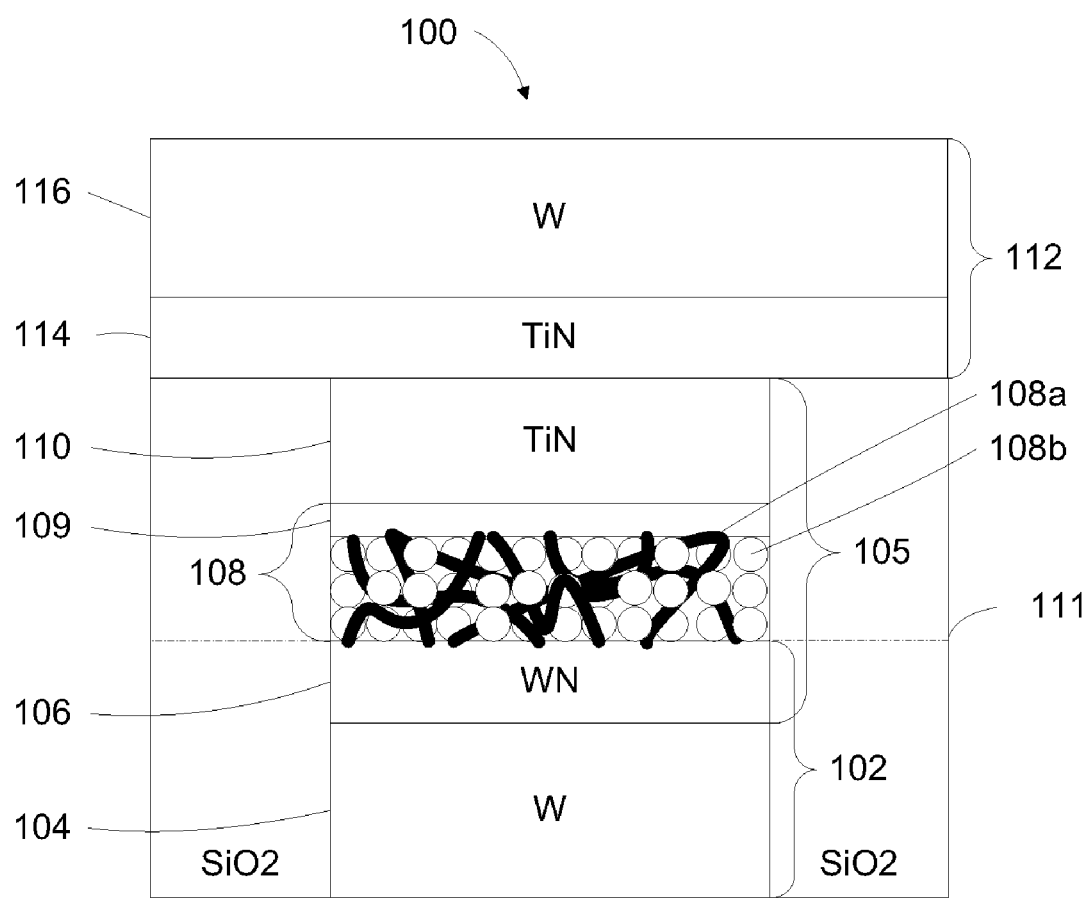
FIG. 1 depicts a cross-sectional, side elevational schematic diagram of an exemplary memory cell in accordance with an embodiment of the present invention, the memory cell comprising a metal-insulator-metal structure.

Carbon nanotube ("CNT") films exhibit resistivity switching behavior that may be used to form microelectronic non-volatile memories. CNT materials have demonstrated reversible resistivity-switching memory properties on lab-scale devices with a 100× separation between ON and OFF states and mid-to-high range resistance changes. Such a separation between ON and OFF states renders CNT materials viable candidates for memory cells formed using the CNT materials in resistivity-switching elements in series with steering elements, such as tunnel junctions, diodes, thin film transistors, or the like.

Indeed, recent development efforts have attempted to improve integration of CNTs in non-volatile memory cells. In one such technique, CNT material is arranged between two electrodes to form a metal-insulator-metal ("MIM") structure that functions as a memory cell. The CNT material sandwiched between the two metal or otherwise conducting layers serves as a resistance change material for the memory cell. Attempts to integrate the CNT material using traditional semiconductor processing techniques, however, have proven technically challenging.

Among the various challenges that integration of pure CNT material presents is that of the topography of CNT material. For instance, deposited or grown CNT material typically has a rough surface topography, with pronounced thickness variations and porosity resulting in local peaks and valleys. These thickness variations make CNT materials difficult to process, e.g., etch, increasing fabrication costs and complexity associated with their use in integrated circuits. Dilution of the CNT material with dielectric filler material may reduce these difficulties.

In particular, aspects of the invention focus on issues involving detrimental changes to the CNT film. For instance, to form a CNT memory circuit using a conventional semiconductor process, physical vapor deposition ("PVD") processing steps are used to form the top and bottom electrodes of the MIM. Memory circuits fabricated using such conventional processing procedures, however, have exhibited numerous failures. For instance, the CNT material in the memory cells may become damaged, the CNT material may delaminate from the bottom electrode, and electrical shorting may occur between the top and bottom electrodes.

Homogeneous carbon nanotube films are known to be porous, so a conventionally-formed CNT-based MIM structure is prone to short-circuiting. High energy levels of PVD-based top electrode metal deposition may cause metal to infiltrate, and possibly penetrate, one or more CNT film pores, possibly causing a short with the bottom electrode. Additionally, the high energy levels used during PVD of metal may cause damage to the active switching CNT material during the top electrode deposition. Temperature changes also may result in delamination of the carbon-based material, e.g., due to differing coefficients of thermal expansion of adjacent layers. For example, a potentially large temperature change may occur when a device is switched, which may cause catastrophic delamination inside the device. Catastrophic delamination may cause large voids inside the device. Embodiments of the present invention seek to avoid such deleterious effects by altering the nature of the resistivity-switchable layer.

In accordance with various exemplary embodiments of the present invention, methods and apparatus may involve a microelectronic structure, such as a memory device, having a resistivity-switchable layer comprising a mixture of dielectric filler material and carbon-based material, such as active CNT material. The dielectric filler material may dilute the carbon-based material in the resistivity-switchable layer.

In accordance with additional exemplary embodiments of the present invention, methods and apparatus may involve a microelectronic structure, such as a memory device, having a CNT MIM stack having a switchable layer comprising a mixture of dielectric filler material and carbon-based material, and the MIM may be integrated in series with a steering element, such as a diode or transistor, to create a read-writable memory device as described, for example, in the '154 Application.

Dielectric dilution of the CNT material may reduce the overall electrical conductivity of the switchable layer, hence may increase the overall electrical resistivity and electrical resistance. Increased overall electrical resistance may reduce the currents allowed at programming voltages and the total power used and imparted thereby. Reduction of the electrical power used to switch the device may tend to reduce the temperature change experienced during switching.

In some embodiments, dielectric dilution of the CNT material also may achieve a balance between the electrical resistivity and the thermal resistance of the resistivity-switchable layer overall. Although a pure CNT material appears to exhibit a thermal resistance lower than that of a mixture of CNT material and filler material, use of a dielectric filler material may reduce the overall thermal resistance of the resistivity-switchable layer, as compared to using a non-dielectric filler material, such as a carbon-based filler material. Reducing the thermal resistance tends to reduce the temperature change experienced when the layer switches resistivities, and hence resistances. Thus, use of a dielectric filler material may reduce the temperature change experienced when the layer switches resistivities, and hence resistances, as compared to using a non-dielectric filler material.

Furthermore, the dielectric filler material in some embodiments may disperse into and seal topside pores of the diluted CNT film, preferably impeding penetration of the top electrode metal into the sealed pores. Similarly, dilution of the CNT material in a dispersion of dielectric filler material may reduce and/or prevent damage to the CNT material during top electrode deposition, in some embodiments, by shielding the carbon-based material from full exposure to the metal deposition process. In some embodiments, for instance, CNT material may be mixed with dielectric filler material, such as silicon nitride nanoparticles, and the mixture may be deposited by spinning them together onto a bottom electrode surface.

In other embodiments, CNT material may be formed on the bottom electrode surface, and dielectric filler material then may be formed on top of the CNT material. For example, a layer of silicon nitride nanoparticles may be spun onto a CNT layer after the CNT layer has been formed. The CNT layer may have pores and/or holes, some of which may be accessible at the top of the film. Therefore, spinning a suspension of dielectric filler material, such as silicon nitride nanoparticles, on top of the CNT material may cause some of the dielectric filler material to fit into the pores and holes of the CNT layer. In that fashion, dielectric filler material may pack into the CNT layer without fully encasing the carbon nanotubes, allowing the carbon nanotubes to connect to a top electrode.

In exemplary embodiments in accordance with this invention, CNT material may act as the primary active carbon-based material of the resistivity-switchable layer. The CNT material may be composed of, but is not limited to, pure carbon nanotubes deposited by CVD growth techniques, colloidal spray on techniques, and spin on techniques. The active switching carbon-based material also may be composed of a mixture of amorphous carbon or other carbon-based material with carbon nanotubes in any ratio deposited in any of the above mentioned techniques. A preferred embodiment of this integration scheme includes a spin or spray application of a heterogeneous dispersion of dielectric nanoparticles mixed with CNT material to create a thin film.

As used herein, CNT is an exemplary carbon-based resistivity switching material forming the active layer, although the carbon material is not limited to pure carbon nanotubes. As used herein, the carbon material also may include carbon in many forms, including graphene, graphite and amorphous carbon, preferably in small amounts. The nature of the carbon-based layer may be characterized by its ratio of forms of carbon-carbon bonding. Carbon typically bonds to carbon to form either an $sp^2$-bond (a trigonal double C=C bond) or an $sp^3$-bond (a tetrahedral single C—C bond). In each case, a ratio of $sp^2$-bonds to $sp^3$-bonds can be determined via Raman spectroscopy by evaluating the D and G bands. In some embodiments, the range of materials may include those having a ratio such as $M_y N_z$ where M is the $sp^3$ material and N is the $sp^2$ material and y and z are any fractional value from zero to 1 as long as $y+z=1$.

Additionally, CNT material deposition methods may include, but are not limited to, spin-on deposition, spray-on deposition, plasma-enhanced chemical vapor deposition ("PECVD"), PVD, CVD, arc discharge techniques, and laser ablation. Deposition temperatures may range from about 300° C. to 900° C. A precursor gas source may include, but is not limited to, hexane, cyclo-hexane, acetylene, single and double short chain hydrocarbons (e.g., methane), various benzene based hydrocarbons, polycyclic aromatics, short chain ester, ethers, alcohols, or a combination thereof. In some cases, a "cracking" surface may be used to promote growth at reduced temperatures (e.g., about 1-100 angstroms of iron ("Fe"), nickel ("Ni"), cobalt ("Co") or the like, although other thicknesses may be used).

In embodiments where the CNT material layer is the active switching layer, the CNT needs to be switchable, even if methods described, like PECVD, are used to form the CNT material. The CNT material may be deposited in any thickness. In some embodiments, the CNT material may be between about 1-1000 angstroms, although other thicknesses may be used. Depending on device construction, such as described herein, preferred ranges may include 200-400 angstroms, 400-600 angstroms, 600-800 angstroms, and 800-1000 angstroms.

Dielectric filler material preferably forms a colloidal filler. Exemplary dielectric filler materials may include, but are not limited to, stoichiometric or non-stoichiometric compounds comprising silicon oxynitride (SiON), silicon nitride ($Si_3N_4$, or simply SiN), silicon dioxide ($SiO_2$, or simply SiO), aluminum oxide ($Al_2O_3$, aka alumina or simply AlO), tantalum (V) oxide ($Ta_2O_5$, aka tantalum pentoxide or simply TaO), and boron carbo-nitride ($BC_xN$, or simply BCN). Higher thermal conductivity dielectric materials are preferred. Nanoparticles of these dielectrics materials are preferred as well.

In working with CNT-only sprayed films, Applicants have observed that a thicker film (e.g., 800 Angstroms-1000 Angstroms) may prevent the top electrode from punching though the resistivity-switchable layer. As discussed above, CNT material is known to be a porous, so metal deposition to form the top electrode is problematic when the metal penetrates one or more pores and causes an electrical short, through the CNT material, to the bottom electrode. For example, an 850-Angstrom-thick layer of CNT-only material did not exhibit any shorting, whereas a 250-Angstrom-thick layer of CNT-only material demonstrated shorting in greater than 80% of the cases. Intermediate thicknesses demonstrated differing, intermediate amounts of shorting, depending on factors such as top-electrode formation technique. All others factors being held constant, such thinner CNT-only layers have not heretofore lent themselves to a commercially viable and manufacturable process due to their variability and unreliability.

To prevent punch though with thinner switchable films, and to shield the CNT material from detrimental exposure during formation of the top electrode, amorphous carbon (aC) filler material may be mixed with the CNT material to fill in these holes. This aC-CNT mixture may be spun on the wafer or substrate like photoresist and may comprise a heterogeneous colloidal suspension of amorphous carbon particles and carbon nanotubes in water.

Although such an aC-CNT mixture may avoid problems arising during device fabrication, such an aC-CNT mixture may not prevent some problems associated with delamination of the resistivity-switchable layer after device fabrication. For instance, switching a resistivity-switchable layer comprising an aC-CNT mixture may momentarily generate detrimentally high temperatures, possibly causing the layer to delaminate due to differences in coefficients of thermal expansion between the switching layer and the bottom electrode.

Aspects of the present invention address both the device fabrication issues as well as this thermally-induced delamination issue by forming resistivity-switchable layers that generate lower temperatures during switching. In particular, mixtures of dielectric filler material and CNT material appear to generate switching temperature changes of less than one twentieth the switching temperature change generated by a similarly-formed resistivity-switching layer comprising an aC-CNT mixture. Inasmuch as in-situ, real-time measurement of momentary switching temperatures appears impracticable, this present application takes a theoretical approach by calculating the thermal resistance and potential temperature change during switching.

As the relationships set forth herein indicate, a higher coefficient of thermal conductivity, k, of an active switching layer results in a lower thermal resistance of the active switching layer, all else being held constant. Likewise, a lower thermal resistance of the active switching layer results in a lower thermal resistance of the MIM overall. Similarly, a lower overall thermal resistance will correspond to a lower change in temperature for a given switching power and duration, all else being held constant. A given switching power and duration yield a given heat balance of the act of switching, as described below, from which the temperature change may be calculated.

As presented below, the thermal resistance and potential temperature change during switching are compared for the situations where (1) the filler material is amorphous carbon, and (2) the filler material is a fab-friendly dielectric. The calculations indicate that the temperature change during switching is reduced drastically when the filler material is changed to a highly thermally conductive dielectric material.

In a preferred embodiment, SiN nanoparticles may mixed with CNT material to achieve a desirable balance of characteristics (e.g., reduced temperature change, durability, ease of fabrication, etc.). Hence, SiN filler material may replace the aC filler material in embodiments disclosed above. Replacement of aC with SiN may reduce the temperature inside the device during switching and may reduce the potential for catastrophic delamination, while maintaining the switching behavior of the CNT material. Replacement of the aC with dielectric filler may achieve, for instance, a resistivity-switchable layer having a reduced thermal resistance of less than 2e7 K/W.

Referring to Table 1, calculated thermal resistance approximations are provided for exemplary spin-coated layers of CNT, aC, and an aC-CNT mixture. These thermal resistance approximations are provided as baselines for comparison with the values calculated for embodiments of the present invention. These approximations assume a device critical dimension, CD, of 45 nm and a switching layer thickness of 250 Angstroms. Theoretically, the three layers respectively comprise 100% CNT; 100% aC; and 80% aC filler, 20% CNT. The thermal resistance, Tr, is calculated according to the equation Tr=($\Delta$x/kA); where $\Delta$x is the material thickness, e.g., 250 Angstroms; k is the coefficient of thermal conductivity, e.g., k(aC)=0.2 W/mK and k(CNT)=200 W/mK; and A is the cross-sectional area of the layer, e.g., A=$\pi r^2$=1.59e-15 $m^2$, where r=45 nm/2.

TABLE 1

| Baseline Thermal Resistance Approximations | | |
|---|---|---|
| 100% CNT | k(CNT) = 200 W/mK | Tr = 7.8616e4 K/W |
| 100% a-C | k(a-C) = 0.20 W/mK | Tr = 7.8616e7 K/W |
| 80%-20% aC-CNT mixture | k(mix) = 0.25 W/mK | Tr = 6.2909e7 K/W |

Referring to Table 2, calculated thermal resistance approximations are provided for exemplary spin-coated layers of mixtures theoretically having (1) 80% SiN filler, 20% CNT; (2) 80% $Al_2O_3$ filler, 20% CNT; and (3) 80% SiON filler, 20% CNT. These thermal resistances are values calculated for exemplary embodiments of the present invention.

These approximations assume a device critical dimension, CD, of 45 nm and a switching layer thickness of 250 Angstroms. As above in Table 2, the thermal resistance, Tr, is calculated according to the equation Tr=($\Delta$x/kA); wherein $\Delta$x is the material thickness, e.g., 250 Angstroms; k is the coefficient of thermal conductivity, and A is the cross-sectional area of the layer, e.g., A=1.59e-15 m².

The coefficients of thermal conductivity of the exemplary dielectric filler materials are, e.g., k(SiN)=30 W/mK, k(Al$_2$O$_3$)=40 W/mK, and k(SiON)=15 W/mK. Values of an 80%-20% mixture are approximated according to Tr(mix)= 0.8*Tr(filler)+0.2*Tr(CNT), and k(mix)=[k(filler)*k(CNT)]/[0.8*k(CNT)+0.2*k(filler)]. The Tr and k are approximated by mixture ratio instead of by equations of thermal resistance in series or parallel. This approximation is not unreasonable for a heterogeneous mixture of CNT and filler material, especially assuming that the CNT material is randomly oriented and not aligned.

TABLE 2

Exemplary Thermal Resistance Approximations

| | | |
|---|---|---|
| 100% SiN | k(SiN) = 30.0 W/mK | Tr = 5.24109e5 K/W |
| 100% Al$_2$O$_3$ | k(Al$_2$O$_3$) = 40.0 W/mK | Tr = 3.93081e5 K/W |
| 100% SiON | k(SiON) = 15.0 W/mK | Tr = 1.04822e6 K/W |
| 80%-20% SiN-CNT mix | k(mix) = 36.1 W/mK | Tr = 4.35547e5 K/W |
| 80%-20% Al$_2$O$_3$-CNT mix | k(mix) = 47.6 W/mK | Tr = 3.30321e5 K/W |
| 80%-20% SiON-CNT mix | k(mix) = 18.4 W/mK | Tr = 8.54526e5 K/W |

Referring to Table 3, calculated temperature change approximations during switching are provided for exemplary spin-coated active layers of a pure CNT layer, a pure aC layer, an aC-CNT mixture, a CNT-SiN mixture, a CNT-Al$_2$O$_3$ mixture, and a CNT-SiON mixture. The approximated coefficients of thermal conductivity, k, for the mixtures also are provided for ease of comparison. All else being equal, a higher coefficient of thermal conductivity appears to correlate with a lower temperature change upon switching.

As with the thermal resistance calculations above, all of these calculations assume a device critical dimension, CD, of 45 nm and a switching layer thickness of 250 Angstroms. Electrode thickness is assumed to be 1200 Angstroms, and the radius has been rounded down to 22 nm. Theoretically, the active layers respectively comprise 100% CNT; 100% aC; 80% aC filler, 20% CNT; 80% SiN filler, 20% CNT; 80% Al$_2$O$_3$ filler, 20% CNT; and 80% SiON filler, 20% CNT.

These approximations are intended for comparison purposes and are not intended to be exact or take every possible variable into account. Moreover, the mixture is assumed to not make complete contact with the bottom and top electrodes. Insofar as an active layer of 100% CNT that is 250 Angstroms thick frequently experiences punch-through, short-circuit failure, the value for its temperature change largely is theoretical.

TABLE 3

Calculated Temperature Change Approximations

| | | |
|---|---|---|
| 100% CNT (theoretical) | k(CNT) = 200.0 W/mK | $\Delta$T = 22.34 K |
| 100% aC | k(a-C) = 0.20 W/mK | $\Delta$T = 414.66 K |
| 80%-20% aC-CNT mixture | k(mix) = 0.25 W/mK | $\Delta$T = 412.84 K |
| 80%-20% SiN-CNT mixture | k(mix) = 36.1 W/mK | $\Delta$T = 99.78 K |
| 80%-20% Al$_2$O$_3$-CNT mixture | k(mix) = 47.6 W/mK | $\Delta$T = 80.25 K |
| 80%-20% SiON-CNT mixture | k(mix) = 18.4 W/mK | $\Delta$T = 159.49 K |

The temperature changes in Table 3 may be derived from heat balances of corresponding structures. The heat balance of the act of switching, e.g., setting or resetting the switching layer, Q(switching), is the cumulative heat balance of each affected part during switching. The affected parts are assumed to include the two electrodes, the active switching layer, and surrounding gap fill. Thus, Q(switching)=Q(electrodes)+Q(active layer)+Q(gap fill). The heat balance Q(switching) is estimated using the switching power, P, times the switching duration time, t, according to the equation Q(switching)=P*t. Switching power, P, is estimated according to the equation P=IV, where I is the switching current and V is the switching voltage.

With a calculated heat balance of the switching event, the heat balances of each subpart may be estimated as a function of the temperature change arising from the switching event. The heat balance may be estimated as the switching time times the change in temperature divided by the thermal resistance, e.g., Q=t*$\Delta$T/(Tr)=t*$\Delta$T*k*A/$\Delta$x. The two electrodes and the active layer may be assumed to form a uniform cylinder surrounded by the gap fill, wherein the electrodes are the same size. Solving for $\Delta$T=Q*Tr/t yielded the $\Delta$T(CNT) =22.34K of Table 3.

Exemplary Embodiments

In accordance with a first exemplary embodiment of this invention, formation of a microelectronic structure includes formation of an MIM device having a carbon film disposed between a bottom electrode and a top electrode, the carbon film comprising a mixture of CNT material and a dielectric filler material. An exemplary ratio of CNT material to dielectric filler material may be 1:4, where the CNT material accounts for 20% of the carbon film, and the dielectric material accounts for 80% of the carbon film. Inasmuch as the dielectric filler material accounts for more than a majority of the carbon film, the carbon film may comprise undamaged, or reduced-damage, CNT material, and the carbon film is not penetrated, and preferably not infiltrated, by the top electrode.

FIG. 1 is a cross-sectional elevational view of a first exemplary microelectronic structure 100, also referred to as memory cell 100, provided in accordance with this invention. Memory cell 100 includes a first conductor 102 formed over a substrate (not shown), such as over an insulating layer over the substrate. The first conductor 102 may include a first metal layer 104, such as a tungsten ("W"), copper ("Cu"), aluminum ("Al"), gold ("Au"), or other metal layer. The first conductor 102 may comprise a lower portion of a MIM structure 105 and function as a bottom electrode of MIM 105. An adhesion layer 106, such as a titanium nitride ("TiN"), tungsten nitride ("WN"), tantalum nitride ("TaN") or similar layer, is optional but is shown in FIG. 1 formed over the first metal layer 104. In general, a plurality of the first conductors 102 may be provided and isolated from one another (e.g., by employing silicon dioxide ("SiO$_2$") or other dielectric material isolation between each of the first conductors 102). For instance, the first conductor 102 may be a word-line or a bit-line of grid-patterned array.

A resistivity-switchable layer 108 containing carbon-based material 108a and dielectric filler material 108b is formed over the first conductor 102 using any suitable formation process. The resistivity-switchable layer 108 may comprise a middle portion of the MIM structure 105, and function as an insulating layer of MIM 105. The carbon-based material 108a may comprise CNT material, also referred to herein as CNT material 108a, which may be deposited by various techniques.

Exemplary CNT formation techniques involve spray- or spin-coating a carbon nanotube suspension over the first conductor 102, thereby creating a random CNT material. The dielectric filler material 108b may be included directly in the suspension, such as in the form of dielectric filler material nanoparticles. Another technique involves growing carbon nanotubes from a seed anchored to the substrate by CVD, PECVD or the like. Discussions of various CNT deposition techniques are found in the '154 application, and related U.S. patent application Ser. No. 11/968,156, "MEMORY CELL THAT EMPLOYS A SELECTIVELY FABRICATED CARBON NANO-TUBE REVERSIBLE RESISTANCE-SWITCHING ELEMENT FORMED OVER A BOTTOM CONDUCTOR AND METHODS OF FORMING THE SAME," filed Dec. 31, 2007, and Ser. No. 11/968,159, "MEMORY CELL WITH PLANARIZED CARBON NANOTUBE LAYER AND METHODS OF FORMING THE SAME," filed Dec. 31, 2007, which are hereby incorporated by reference herein in their entireties for all purposes. Dielectric filler material 108b may be formed, such as by deposition, interspersed between the CNTs of the CNT material 108a.

In some embodiments in accordance with this invention, deposition/formation of the CNT material 108a also may include an optional additional interface material 109. Although FIG. 1 depicts interface material 109 located above the CNT material 108a, additional interface material 109 may be formed above, within, and/or below the CNT material 108a, relative to the substrate. For instance, a resistivity-switchable layer 108 may include additional interface material 109 below and above the CNT material 108a and dielectric filler material 108b, which may help adhesion or prevent metal penetration from the bottom electrode as well as the top electrode. The additional interface material 109 may be a by-product of the formation of the CNT material 108a, or it may be separately formed. The additional interface material 109 may be intended to improve adhesion between the layers or otherwise stabilize the resistivity-switchable layer 108, but without interfering with the switching of the resistivity-switchable layer 108. The additional interface material 109 would need to be compatible with both the CNT material 108a and the dielectric filler material 108b. For instance, additional interface material 109 might include a monolayer of carbon nitride ("CN"), or the adhesion/barrier layer 106 may be WN with a treatment of N stuffing to make the interface more compatible with silicon nitride.

If present, the interface material 109 and its thickness also may be selected to exhibit properties that do not undermine or interfere with the thermal resistance reduction, and hence temperature change reduction upon switching, achieved by incorporation of dielectric filler material 108b.

Likewise, the vertical electrical resistance of interface material 109 should be appropriate for memory cell 100 in which it is incorporated, taking into account, for example, preferred read, write, and programming voltages or currents. Vertical resistance, e.g., in the direction of current travel between the two electrodes as shown in FIG. 1, of the layers 108 and 109 will determine current or voltage differences during operation of structure 100. Vertical resistance depends, for instance, on material vertical resistivity and thickness, and feature size and critical dimension. In the case of CNT material 108a, vertical resistance may differ from horizontal resistance, depending on the orientation of the carbon nanotubes themselves, as they appear to be more conductive along the tubes than between the tubes.

After formation of the interface material 109, an adhesion/barrier layer 110, such as TiN, TaN, WN, tantalum carbon nitride ("TaCN"), or the like, may be formed over the resistivity-switchable layer 108. As shown in FIG. 1, adhesion layer 110 may function as a top electrode of MIM device 105 that includes resistivity-switchable layer 108 as the insulating layer, and first metal layer 104 and optional adhesion layer 106 as the bottom electrode. As such, the following sections refer to adhesion/barrier layer 110 as "top electrode 110" of MIM 105.

In some embodiments in accordance with this invention, top electrode 110 may be deposited using a lower energy deposition technique, e.g., one involving energy levels lower than those used in conventional PVD of similar materials. Such exemplary deposition techniques may include low bias power physical vapor deposition (LBP-PVD), low temperature PVD, and other similar techniques.

Use of a lower energy deposition technique to deposit top electrode 110 on the carbon material reduces the potential for deposition-associated damage to the CNT layer 108 and the potential for infiltration and/or penetration of CNT layer 108 by the top electrode 110. In embodiments foregoing the use of an interface liner 109, use of lower energy deposition techniques may be particularly advantageous to limit the deleterious effects of the deposition of the top electrode 110. Subsequent to the deposition of top electrode 110, the CNT material 108a preferably remains undamaged, and resistivity-switchable layer 108 preferably remains substantially free of top electrode 110 material, which otherwise might have infiltrated the resistivity-switchable layer 108, especially under higher-energy, PVD-type conditions.

Even if the resistivity-switchable layer 108 experiences some damage or infiltration at a top portion (e.g., preferably dielectric filler material 108b or interface material 109) serving as an interface with the top electrode 110, at least a core portion of the resistivity-switchable layer 108 (e.g., CNT material 108a) remains functional as a switching element, being undamaged and not infiltrated. The top electrode 110 preferably forms an interface having a sharp profile delimiting the top electrode material from the carbon material. In the event that no interface 109 is present, the possibly-compromised top portion and functioning core may be subdivisions of resistivity-switchable layer 108. This result preferably applies to the embodiments FIGS. 2-4 as well.

The stack may be patterned, for example, with photoresist (PR) using standard photolithographic techniques. For 0.5 µm technology, about 1 to about 1.5 micron, more preferably about 1.2 to about 1.4 micron, of PR may be appropriate. For smaller technology nodes, such as 0.15 µm and 50 nm, less PR generally is needed. The PR may be used in conjunction with a hard mask, such as an oxide hard mask (not shown), such that the PR is used to pattern the hard mask, the PR is stripped, and then the hard mask is used to pattern lower layers. The CNT materials and top electrode 110 then may be etched using any suitable etch, such as oxygen ("$O_2$"), boron trichloride ("$BCl_3$") and/or chlorine ("$Cl_2$") chemistries, for example, as described in U.S. Patent Application Ser. No. 61/081,029, filed 15 Jul. 2008, "METHODS FOR ETCHING CARBON NANO-TUBE FILMS" (the '029 application), which is incorporated by reference herein in its entirety for any purpose. In some embodiments, the top electrode 110 and the resistivity-switchable layer 108 may be patterned using a single etch step. In other embodiments, separate etch steps may be used. A single photolithography step may be used to pattern the entire layer stack of MIM 105. Such an etched film stack has been observed to have nearly vertical sidewalls and little or no undercut of the CNT material 108. Other etch chemistries may be used.

The defined top electrode/CNT-dielectric mixture features may be isolated with $SiO_2$ or other dielectric fill 111, and then planarized. A second conductor 112 may be formed over the top electrode 110. The second conductor 112 may include a barrier/adhesion layer 114, such as TiN, WN, TaN or a similar material, and a metal layer 116 (e.g., tungsten or other conductive material).

The MIM device 105 may serve as a state change material for memory cell 100. The resistivity-switchable layer 108 may form a switchable memory element of the memory cell, wherein the memory element is adapted to switch two or more resistivity states. For example, the MIM device 105 may be coupled in series with a steering element such as a diode, a tunnel junction, or a thin film transistor ("TFT"). In at least one embodiment, the steering element may include a polycrystalline vertical diode.

Memory operation is based on a bi-stable resistance change in the resistivity-switchable layer 108 with the application of high bias voltage (e.g., >4 V). Current through the memory cell is modulated by the resistance of the CNT material 108a. The memory cell is read at a lower voltage that will not change the resistance of the CNT material 108a. In some embodiments, the difference in resistivities between the two states may be over 100×. The memory cell may be changed from a "0" to a "1," for example, with the application of high forward bias on the steering element (e.g., a diode). The memory cell may be changed back from a "1" to a "0" with the application of a high forward bias. As stated, this integration scheme can be extended to include CNT material 108a in series with a TFT as the steering element instead of a vertical pillar diode. The TFT steering element may be either planar or vertical.

In accordance with a second embodiment of this invention, formation of a microelectronic structure includes formation of a diode in series with an MIM device having a carbon film disposed between a bottom electrode and a top electrode, the carbon film comprising a mixture of CNT material and a dielectric filler material. The carbon film may comprise a resistivity-switchable layer that has undamaged, or reduced-damage, CNT material and that is not penetrated, and preferably not infiltrated, by the top electrode.

Figure 2A:
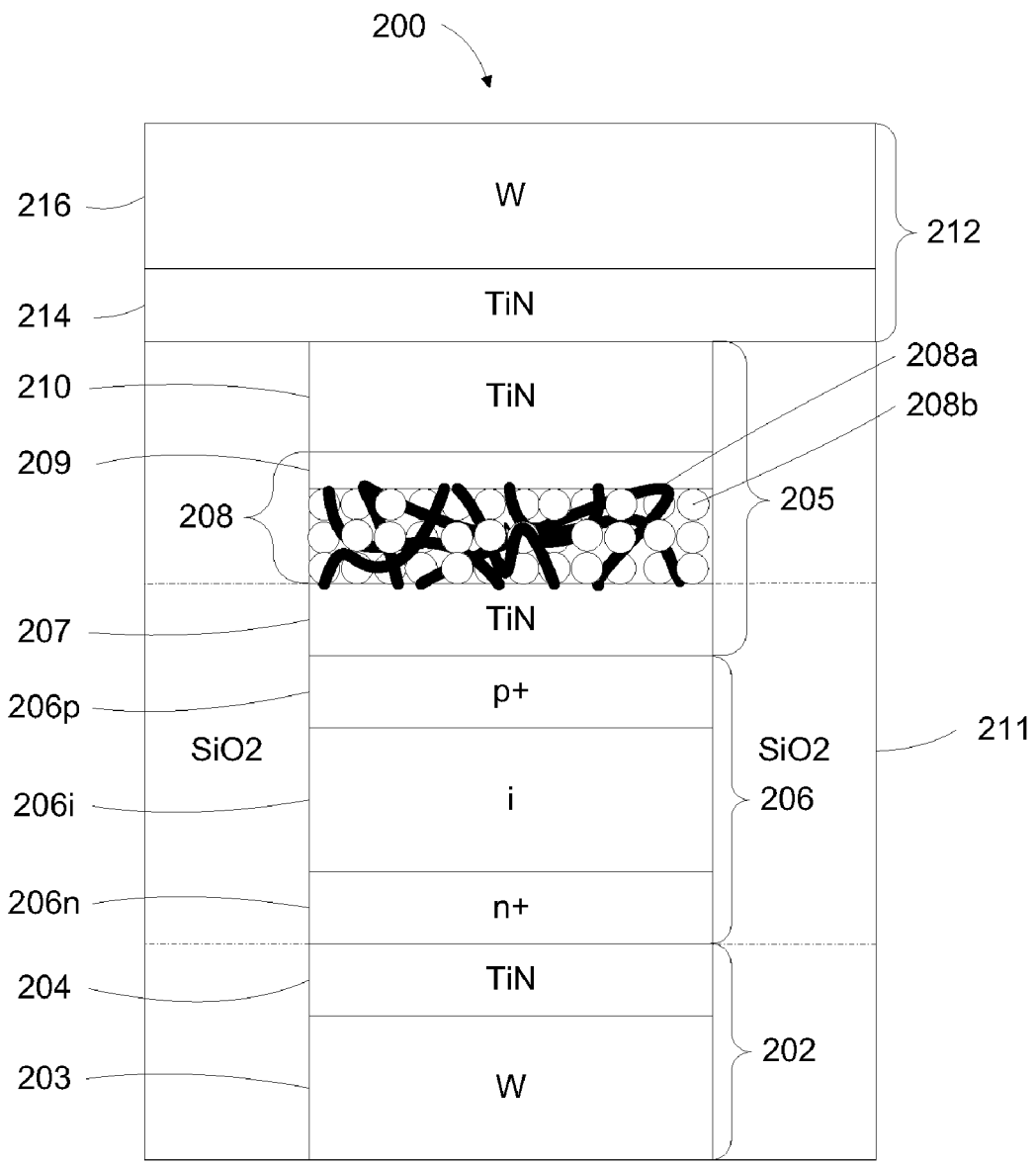
FIG. 2 includes FIGS. 2A and 2B, which depict side elevational cross-sections of other exemplary memory cells in accordance with embodiments of the present invention, each memory cell comprising a metal-insulator-metal structure in series with a diode.
Figure 2B:
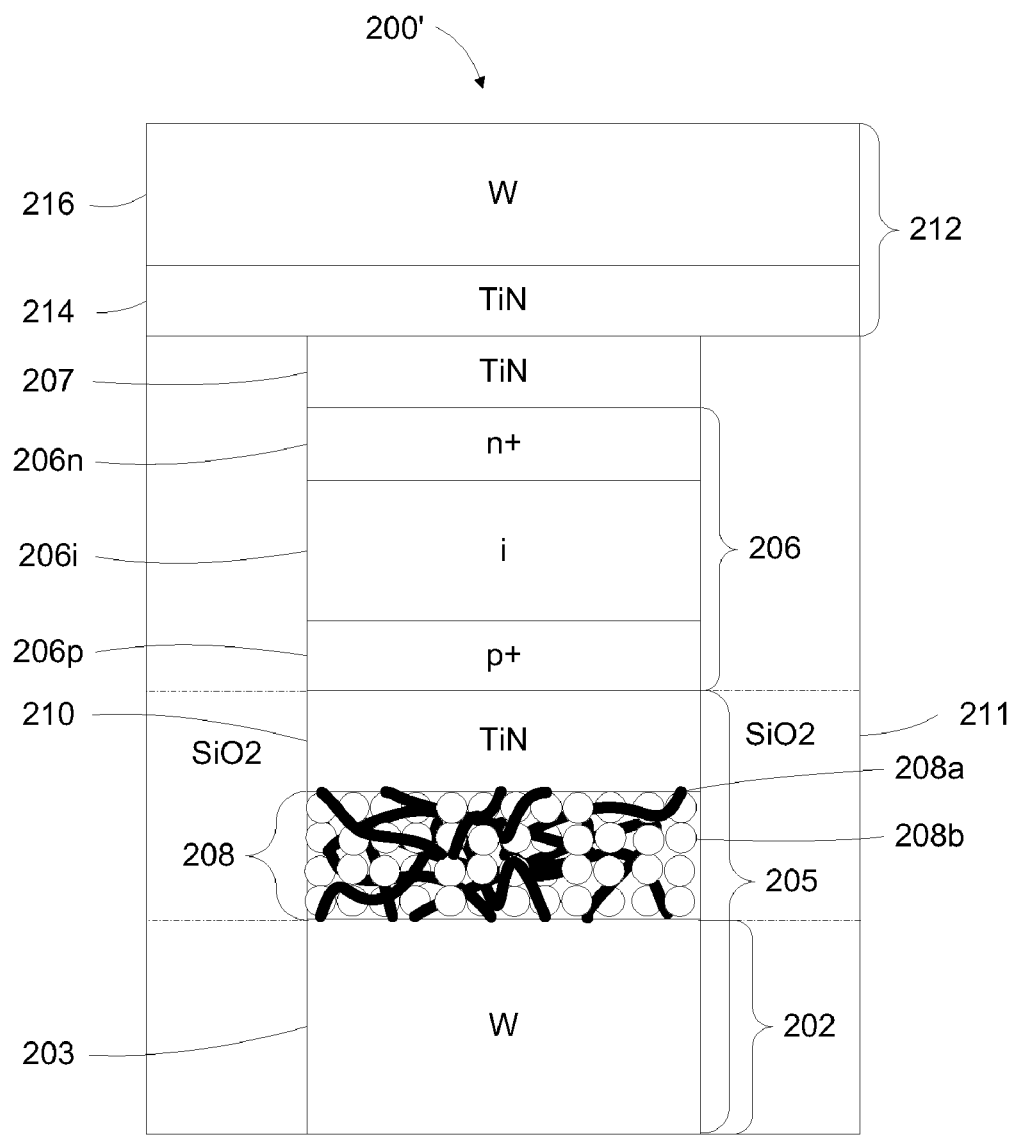

FIG. 2 is a cross-sectional elevational view of an exemplary memory cell structure 200 provided in accordance with the present invention. FIG. 2 comprises FIGS. 2A and 2B, which depict layers of the memory cell formed in different orders. In FIG. 2A, memory cell structure 200 includes a diode disposed below an MIM device having a CNT film covered by a interface protective layer and disposed between a bottom electrode and a top electrode. In FIG. 2B, memory cell structure 200' has the diode disposed above the MIM device.

As shown in FIG. 2A, the memory cell structure 200 includes a first conductor 202 formed over a substrate (not shown), such as over an insulating layer covering the substrate. The first conductor 202 may include a first metal layer 203, such as a W, Cu, Al, Au, or other metal layer, with a first barrier/adhesion layer 204, such as a TiN, WN, TaN or similar layer, formed over the first metal layer 203. As shown in FIG. 2B, the first barrier/adhesion layer 204 is omitted, but were it present, it may comprise a lower portion of a MIM structure 205 and function as a bottom electrode of MIM 205.

In general, a plurality of the first conductors 202 may be provided and isolated from one another. For instance, after patterning and etching first conductors 202, a gap fill deposition of $SiO_2$ or other dielectric material may isolate each of the first conductors 202. After depositing dielectric material over the first conductors 202, the device structure may be planarized to re-expose the electrically-isolated first conductors 202.

A vertical P-I-N (or N-I-P) diode 206 may be formed above the first conductor 202. For example, the diode 206 may include a polycrystalline (e.g., polysilicon, polygermanium, silicon-germanium alloy, etc.) diode. Diode 206 may include a layer 206n of semiconductor material heavily doped a dopant of a first-type, e.g., n-type; a layer 206i of intrinsic or lightly doped semiconductor material; and a layer 206p of semiconductor material heavily doped a dopant of a second-type, e.g., p-type. Alternatively, as shown in FIG. 2B, the vertical order of the diode 206 layers 206n, 206i, and 206p may be reversed.

In some embodiments, a silicide region (not shown in FIG. 2) may be formed in contact with the diode 206, above or below it. As described in U.S. Pat. No. 7,176,064, "MEMORY CELL COMPRISING A SEMICONDUCTOR JUNCTION DIODE CRYSTALLIZED ADJACENT TO A SILICIDE," which is hereby incorporated by reference herein in its entirety, silicide-forming materials such as titanium and cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the diode 206 during annealing). Lower resistivity silicon thereby is provided. Similar results may be achieved for silicon-germanium alloy and/or germanium diodes.

A TiN, TaN, W, WN, TaCN or other adhesion/barrier layer 207 may be formed above the diode 206. In some embodiments, a metal hard mask such as W or the like may be employed on top of the adhesion/barrier layer 207. The adhesion/barrier layer 207 and diode 206 may be patterned and etched to form a pillar. In general, a plurality of these pillars may be provided and isolated from one another, such as by employing $SiO_2$ or other dielectric material isolation between each of the pillars (e.g., by depositing dielectric material over the pillars and then planarizing the device structure to re-expose the electrically-isolated pillars). The diode pillar 206 may be patterned separately or together with MIM 205 layers above or below it in a single photolithography step.

As shown in FIG. 2A, adhesion layer 207 may function as a bottom electrode of MIM device 205. MIM 205 may include a resistivity switchable layer 208, having CNT material 208a, dielectric filler material 208b, and optional interface material 209, as the insulating layer. MIM 205 may have an adhesion layer 210 as a top electrode. As such, the following sections refer to adhesion/barrier layer 207 as "bottom electrode 207" of MIM 205 with respect to FIG. 2A.

CNT material 208a may be formed over the bottom electrode 207 using any suitable CNT formation process (as described previously). In some embodiments in accordance with this invention, before and/or after formation of the CNT material 208a, a second interface material layer 209 may be formed as a protective liner above or below the CNT material 208a. The interface material 209 may be formed as described above, such as described previously with reference to FIG. 1. In the embodiment shown in FIG. 2B, the diode 206 may be positioned above the CNT material 208a and interface liner 209 is omitted.

Following deposition/formation of the CNT material 208a, dielectric filler material 208b, and interface liner 209, a second adhesion/barrier layer 210, such as TiN, WN, TaN or the like, is formed over the resistivity-switchable layer 208. As described above, adhesion layer 210 may function as a top electrode of MIM 205. As such, the following sections refer to adhesion/barrier layer 210 as "top electrode 210" of MIM 205.

In some embodiments in accordance with this invention, top electrode 210 may be deposited using a lower energy deposition technique, as discussed above. The stack may be patterned using photoresist using standard photolithographic techniques, as described above. The stack then is etched.

In some embodiments, the CNT material 208a and interface liner 209 may be etched using a different etch step than the etch step used for the top electrode 210 (e.g., consecutively in the same chamber). For example, the top electrode 210 may be etched using a chlorine process while the CNT material 208a may be etched using an oxygen or chlorine-argon chemistry. In other embodiments, a single etch step may be used (e.g., using an oxygen or chlorine-argon chemistry).

Such an etched film stack has been observed to have nearly vertical sidewalls and little or no undercut of the CNT material 208a. The defined top electrode/CNT-dielectric features are then isolated with $SiO_2$ or other dielectric fill 211, planarized and a second conductor 212 is formed over the top electrode 210 and gap fill 211. The second conductor 212 may include a barrier/adhesion layer 214, such as TiN, WN, TaN or a similar layer, and a metal layer 216, such as a W or other conductive layer.

In some embodiments, the etch stack may include about 1 to about 1.5 microns of photoresist for a 500 nm technology node, with less PR for smaller technology nodes, about 2250 to about 2750 angstroms of $SiO_2$ hardmask, about 1800 to about 2200 angstroms of TiN (per TiN layer), about 250 to about 500 angstroms of a mixture of 20% CNT material 208a and 80% dielectric filler material 208b, such as SiN nanoparticles, and about 25 to about 100 angstroms of interface material 209. Other material thicknesses may be used. An exemplary metal etcher is the LAM 9600 metal etcher, available from Lam of Fremont, Calif. Other etchers may be used.

In some embodiments, the photoresist ("PR") may be ashed using standard procedures before continuing to the etch of adhesion/barrier and resistivity-switchable layers, while in other embodiments the PR is not ashed until after the resistivity-switchable layer etch. In some embodiments, an ashing process may include two steps (e.g., when a third high pressure oxygen step is removed). Exemplary process conditions for the first and second ashing steps are provided in the '029 application referenced above. Other etch parameters, flow rates, pressures, RF powers and/or times may be used.

In accordance with a third exemplary embodiment of this invention, formation of a microelectronic structure includes formation of a diode in series with an MIM device having CNT material, such as in FIG. 2. The third embodiment of the invention also includes a dielectric sidewall liner provided to protect the CNT material from degradation during a dielectric fill step. The dielectric liner and its use are compatible with standard semiconductor tooling. Further details are available in the '029 application, referenced above.

In some embodiments, use of a pre-dielectric fill liner provided the highest yield of devices with forward currents in the range from about $10^{-5}$ to about $10^{-4}$ amperes. Additionally, use of a SiN liner provided individual devices with the largest cycles of operation. Moreover, data indicate that using thin SiN as a protective barrier against CNT material degradation during a dielectric fill improves electrical performance.

In accordance with a fourth exemplary embodiment of this invention, formation of a microelectronic structure includes formation of a monolithic three dimensional memory array including memory cells comprising an MIM device having a carbon film disposed between a bottom electrode and a top electrode. Functioning as a carbon-based memory element, the carbon film may comprise a resistivity-switchable layer comprising a mixture of CNT material and a dielectric filler material. The carbon film may comprise an optional interface material protecting undamaged, or reduced-damage, CNT material. The resistivity-switchable layer preferably is not penetrated or infiltrated by the top electrode. The top electrode in the MIM may be deposited using a lower energy deposition technique.

Figure 3:
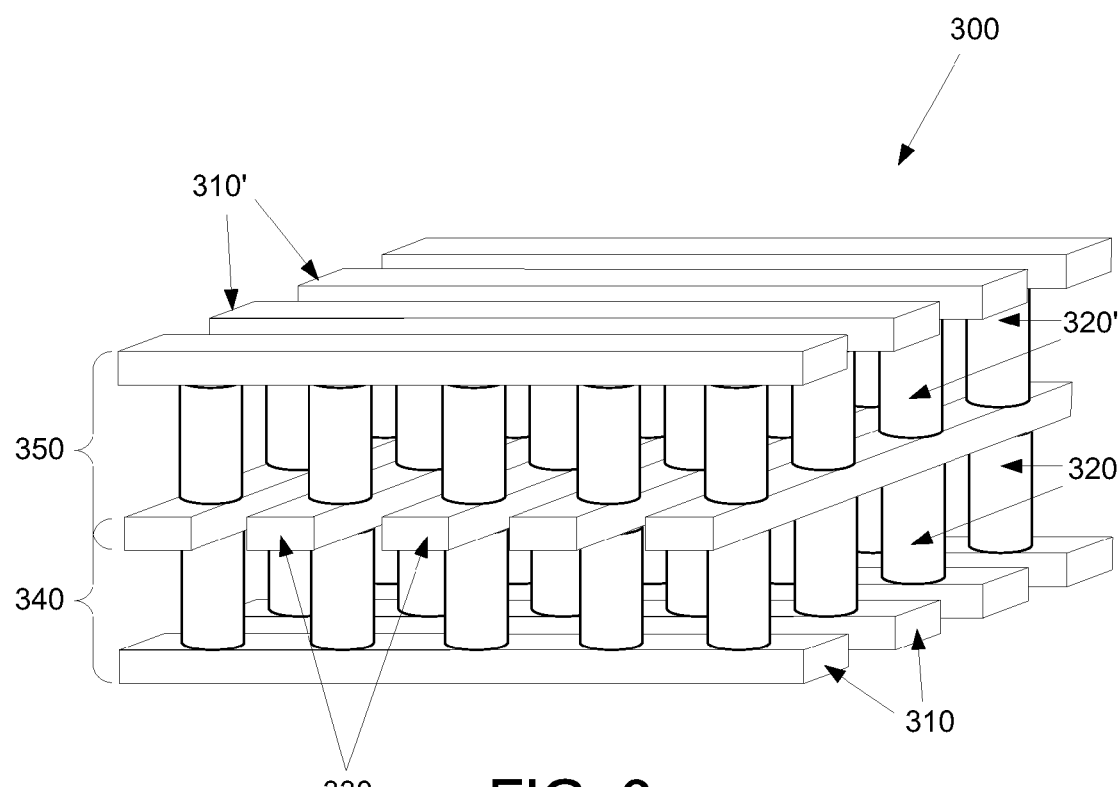
FIG. 3 is a perspective view of an exemplary memory level of a monolithic three dimensional memory array provided in accordance with the present invention.

FIG. 3 shows a portion of a memory array 300 of exemplary memory cells formed according to the fourth exemplary embodiment of the present invention. Memory array 300 may include first conductors 310, 310' that may serve as wordlines or bitlines, respectively; pillars 320, 320' (each pillar 320, 320' comprising a memory cell); and second conductors 330, that may serve as bitlines or wordlines, respectively. First conductors 310, 310' are depicted as substantially perpendicular to second conductors 330. Memory array 300 may include one or more memory levels. A first memory level 340 may include the combination of first conductors 310, pillars 320 and second conductors 330, whereas a second memory level 350 may include second conductors 330, pillars 320' and first conductors 310'. Fabrication of such a memory level is described in detail in the applications incorporated by reference herein.

Embodiments of the present invention prove particularly useful in formation of a monolithic three dimensional memory array. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167. The substrates may be thinned or removed from the memory levels before bonding, but as the memory levels are initially formed over separate substrates, such memories are not true monolithic three dimensional memory arrays.

Related memory structures and formation methods are described in Herner et al., U.S. patent application Ser. No. 10/955,549, "NONVOLATILE MEMORY CELL WITHOUT A DIELECTRIC ANTIFUSE HAVING HIGH- AND LOW-IMPEDANCE STATES," filed Sep. 29, 2004 (hereinafter the '549 application); Herner et al., U.S. patent application Ser. No. 11/148,530, "NONVOLATILE MEMORY CELL OPERATING BY INCREASING ORDER IN POLYCRYSTALLINE SEMICONDUCTOR MATERIAL," filed Jun. 8, 2005 (the "'530 application"); Herner et al., U.S. Pat. No. 7,285,464, (the "'464 patent"); and Herner et al., U.S. Pat. No. 6,952,030, "A HIGH-DENSITY THREE-DIMENSIONAL MEMORY CELL," each of which is hereby incorporated by reference herein in its entirety. To avoid obscuring the present invention, this detail will be not be reiterated in this description, but no teaching of these or other incorporated patents or applications is intended to be excluded. It will be understood that the above examples are non-limiting, and that the details provided herein can be modified, omitted, or augmented while the results fall within the scope of the invention.

The foregoing description discloses exemplary embodiments of the invention. Modifications of the above disclosed apparatus and methods that fall within the scope of the invention will be readily apparent to those of ordinary skill in the art. Accordingly, although the present invention has been disclosed in connection with exemplary embodiments, it should be understood that other embodiments may fall within the spirit and scope of the invention, as defined by the following claims.

The invention claimed is:

1. A method of forming a microelectronic structure, the method comprising:
   forming a resistivity-switchable layer on a bottom electrode; and
   forming a top electrode above and in contact with the resistivity-switchable layer;
   wherein the resistivity-switchable layer comprises a carbon-based material and a dielectric filler material, wherein the carbon-based material comprises carbon nanotubes.

2. The method of claim 1, wherein the dielectric filler material comprises colloidal nanoparticles.

3. The method of claim 1, wherein the dielectric filler material comprises a high thermal conductivity dielectric material having a coefficient of thermal conductivity of at least 15 W/mK.

4. The method of claim 1, wherein the resistivity-switchable layer has a reduced thermal resistance of less than 2e7 K/W.

5. The method of claim 1, wherein forming the resistivity-switchable layer comprises spinning a heterogeneous dispersion onto a substrate to create a thin film.

6. The method of claim 1, wherein the dielectric filler material comprises stoichiometric or non-stoichiometric silicon nitride.

7. The method of claim 1, wherein the dielectric filler material comprises stoichiometric or non-stoichiometric silicon oxynitride.

8. The method of claim 1, wherein the dielectric filler material comprises stoichiometric or non-stoichiometric aluminum oxide.

9. The method of claim 1, wherein the dielectric filler material comprises stoichiometric or non-stoichiometric silicon dioxide, tantalum oxide, or boron carbon nitride.

10. The method of claim 1, wherein the top electrode does not penetrate through the resistivity-switchable layer.

11. The method of claim 1, wherein the resistivity-switchable layer has a thickness of at most 300 angstroms.

12. The method of claim 1, wherein the bottom electrode, the resistivity-switchable layer, and the top electrode comprise a metal-insulator-metal (MIM) stack comprising a memory cell.

13. A microelectronic structure comprising:
    a bottom electrode;
    a resistivity-switchable layer disposed above and in contact with the bottom electrode; and
    a top electrode disposed above and in contact with the resistivity-switchable layer;
    wherein the resistivity-switchable layer comprises a carbon-based material and a dielectric filler material, wherein the carbon-based material comprises carbon nanotubes.

14. The microelectronic structure of claim 13, wherein the dielectric filler material comprises colloidal nanoparticles.

15. The microelectronic structure of claim 13, wherein the dielectric filler material comprises a high thermal conductivity dielectric material having a coefficient of thermal conductivity of at least 15 W/mK.

16. The microelectronic structure of claim 13, wherein the resistivity-switchable layer has a reduced thermal resistance of less than 2e7 K/W.

17. The microelectronic structure of claim 13, wherein forming the resistivity-switchable layer comprises a thin film of a heterogeneous dispersion.

18. The microelectronic structure of claim 13, wherein the dielectric filler material comprises stoichiometric or non-stoichiometric silicon nitride.

19. The microelectronic structure of claim 13, wherein the dielectric filler material comprises stoichiometric or non-stoichiometric silicon oxynitride.

20. The microelectronic structure of claim 13, wherein the dielectric filler material comprises stoichiometric or non-stoichiometric aluminum oxide.

21. The microelectronic structure of claim 13, wherein the dielectric filler material comprises stoichiometric or non-stoichiometric silicon dioxide, tantalum oxide, or boron carbon nitride.

22. The microelectronic structure of claim 13, wherein the top electrode does not penetrate through the resistivity-switchable layer.

23. The microelectronic structure of claim 13, wherein the resistivity-switchable layer has a thickness of at most 300 angstroms.

24. The microelectronic structure of claim 13, wherein the bottom electrode, the resistivity-switchable layer, and the top electrode comprise a metal-insulator-metal (MIM) stack comprising a memory cell.

* * * * *